United States Patent
Dilocker et al.

(10) Patent No.: US 6,803,434 B2
(45) Date of Patent: Oct. 12, 2004

(54) PROCESS FOR PRODUCING ANHYDRIDE-CONTAINING POLYMERS FOR RADIATION SENSITIVE COMPOSITIONS

(75) Inventors: Stephanie Dilocker, Pawtucket, RI (US); Sanjay Malik, Attleboro, MA (US); Binod De, Providence, RI (US); Ashok Reddy, Louisville, IN (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 43 days.

(21) Appl. No.: 10/376,037

(22) Filed: Feb. 27, 2003

(65) Prior Publication Data

US 2003/0225233 A1 Dec. 4, 2003

Related U.S. Application Data

(60) Provisional application No. 60/365,586, filed on Mar. 19, 2002.

(51) Int. Cl.[7] .............................................. C08F 122/04
(52) U.S. Cl. ....................... 526/204; 526/213; 526/271; 526/328.5
(58) Field of Search ................................ 526/204, 213, 526/271, 328.5

(56) References Cited

U.S. PATENT DOCUMENTS

| | | | |
|---|---|---|---|
| 5,843,624 A | 12/1998 | Houlihan et al. | 430/296 |
| 6,165,682 A | 12/2000 | Foster et al. | 430/270.41 |
| 6,455,226 B1 * | 9/2002 | Lee et al. | 430/270.1 |
| 6,632,903 B2 * | 10/2003 | Jung et al. | 526/269 |
| 2002/0197469 A1 | 12/2002 | Clikeman et al. | 428/343 |

OTHER PUBLICATIONS

International Search Report dated Jul. 17, 2003.

* cited by examiner

*Primary Examiner*—Helen L. Pezzuto
(74) *Attorney, Agent, or Firm*—Ohlandt, Greeley, Ruggiero & Perle, L.L.P.

(57) ABSTRACT

A synthetic process comprising the following steps: providing a reaction mixture comprising: an ethylenically unsaturated anhydride monomer, at least one ethylenically unsaturated non-anhydride monomer, a free radical initiator, and an alkyl substituted THF solvent having the general structure of formula 1:

Formula 1

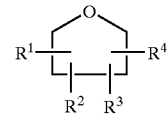

where $R^1$, $R^2$, $R^3$, and $R^4$ are independently chosen from the group hydrogen and $C_1$–$C_4$ linear or branched alkyl with the proviso that at least one of $R^1$, $R^2$, $R^3$, and $R^4$ is not H; polymerizing the reaction mixture; and removing, by distillation, unreacted monomers, the alkyl substituted THF solvent, and any low boiling volatile reaction products.

27 Claims, No Drawings

PROCESS FOR PRODUCING ANHYDRIDE-CONTAINING POLYMERS FOR RADIATION SENSITIVE COMPOSITIONS

RELATED APPLICATION

This application claims priority from Provisional Patent Application Ser. No. 60/365,586, filed Mar. 19, 2002.

FIELD OF THE INVENTION

This invention describes a novel process for producing anhydride-containing polymers for radiation sensitive compositions.

BACKGROUND OF THE INVENTION

Typically polymers based on anhydride monomers are produced by free radical polymerization of an ethylenically unsaturated anhydride in combination with other suitable olefinic monomers, a free radical initiator (e.g. benzoyl peroxide, 2,2'-azobisisobutyronitrile, 2,2'-azobis (methylisobutyronitrile), dimethyl 2,2'-azobisisobutyrate and lauroyl peroxide) and optionally a chain transfer agent (e.g. carbon tetrabromide). Tetrahydrofuran (THF) is the common solvent used as polymerization medium in the laboratory. A typical process used in the production of such polymers involves three steps: polymerizing monomers in tetrahydrofuran (THF) in the presence of a free radical initiator for 16–24 hours, isolating polymer from THF and removing unconverted monomers by precipitation in a large excess of a non-solvent such as hexane, drying the polymer in an oven for 14–36 hours under vacuum at a temperature less than 70° C. and dissolving the dried polymer in a suitable solvent or solvent mixture typically employed in microelectronic industry. Typical examples of such solvents are propylene glycol methyl ether acetate (i.e., PGMEA), 2-heptanone and n-butyl acetate. The polymerization time is determined by residual amounts of monomers along with maleic anhydride, which can contribute to absorbance of photoresist films.

Examples of the various conventional methods for producing such anhydride-containing polymers for radiation sensitive compositions are set forth in U.S. Pat. Nos. 6,165,682 and 5,843,624, which are incorporated herein by reference.

Production of such polymers in larger scale quantities may be limited due to the use of THF as polymerization solvent. THF poses several safety hazards on a production scale due to low flash point (−17° C.), high flammability and low boiling point (65–66° C.). Hexane also poses safety hazards due to low boiling point (69° C.) and high flammability. Since THF is not a suitable solvent for photoresist applications, polymers must be isolated and redissolved in appropriate solvents. Moreover, the isolation step generates large quantities of waste solvent. The third step of drying the polymer for 14–36 hours adds to the energy cost and cycle time. The last steps also introduce the potential for trace metals (microelectronic materials must contain no more than 10 ppb) and water contamination (water can open the maleic anhydride in the backbone which can in turn degrade the polymer). In addition, longer polymerization times of 16 to 24 hours further increase cost of production. Therefore, it is the objective of this invention to develop a novel process for producing radiation-sensitive maleic anhydride-containing polymers. The novel process is developed utilizing environmentally friendly solvents and is targeted for lower production cost.

Solvents such as alcohols are not available for ethylenically unsaturated anhydride polymerizations because of reactivity concerns. Common techniques for controlling molecular weight (MW) (e.g. dodecanthiol or alcohol change transfer agents) cannot be used because of reactivity. Thus, synthetic processes for anhydride based polymers have significant limitations that other synthetic processes do not have in the preparation of anhydride polymers with low trace metals, low water content, controlled molecular weight, and narrow dispersivity at reasonable cost.

Therefore, the present inventors have developed a novel synthetic process for producing anhydride-containing polymers for radiation-sensitive compositions that is environmentally friendly, of reasonable cost and prepares polymers with controlled MW, dispersivity, and trace metal contamination.

The present invention also provides many additional advantages which shall become apparent as described below.

SUMMARY OF THE INVENTION

The synthetic process of this invention for producing anhydride-containing polymers comprises:

a) providing a reaction mixture comprising: an ethylenically unsaturated anhydride monomer, at least one ethylenically unsaturated non-anhydride monomer, a free radical initiator, and an alkyl substituted THF solvent having the general structure of formula 1:

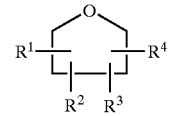

Formula 1 where $R^1$, $R^2$, $R^3$, and $R^4$ are independently chosen from the group hydrogen and $C_1$–$C_4$ linear or branched alkyl with the proviso that at least one of $R^1$, $R^2$, $R^3$, and $R^4$ is not H;

b) polymerizing the reaction mixture; and c) removing, such as by distillation, unreacted monomers, the alkyl substituted THF solvent, and any low-boiling volatile reaction products (i.e., reaction products having a lower boiling point than the boiling point of any co-solvent employed).

DETAILED DESCRIPTION OF THE INVENTION AND PREFERRED EMBODIMENTS

A synthetic process for producing anhydride-containing polymers in accordance with this invention comprises the following steps: providing a reaction mixture comprising: an ethylenically unsaturated anhydride monomer, at least one ethylenically unsaturated non-anhydride monomer, a free radical initiator, and an alkyl substituted THF solvent having the general structure of formula 1:

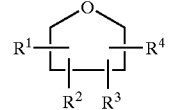

Formula 1 where $R^1$, $R^2$, $R^3$, and $R^4$ are independently chosen from the group hydrogen and $C_1$–$C_4$ linear or branched alkyl with the proviso that at least one of $R^1$, $R^2$, $R^3$, and $R^4$ is not H; polymerizing the reaction mixture; and removing, by distillation, unreacted monomers, alkyl substituted THF solvent, and volatile reaction products.

Suitable anhydrides for this process include any ethylenically unsaturated anhydride that can be polymerized by free radical initiation. Examples include, but are not limited to, maleic anhydride, itaconic anhydride, and the norbornene compound having the general structure of Formula 2 hereinafter. Maleic anhydride is preferred.

Formula 2

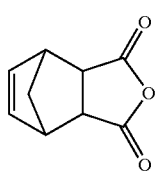

Suitable ethylenically unsaturated monomers include any ethylenically unsaturated monomer that can be polymerized by free radical initiator. Examples of classes of suitable monomers may be selected from the group consisting of: (meth)acrylates, vinyl ethers, vinyl esters, sulfur dioxide, acrylonitriles, and other substituted vinyl monomers. Specific examples include methyl methacrylate, t-butyl methacrylate, adamantyl methacrylate, methyl adamantyl methacrylate, hydroxyadamantyl methacrylate, 1-adamantyl-1-methylethyl methacrylate, isobornyl methacrylate, 1,1-dimethylpropryl acrylate, allyl trimethyl silane, vinyl fluoride, difluoroethylene, trifluoroethylene, tetrafluoroethylene, vinyl chloride, vinyl acetate, and t-butyl vinyl ether.

The total concentration of monomers should account for about 30 to about 70%, by weight of the total solution. It is preferred that about 40 to about 60%, by weight of the total solution be the monomers. It is most preferred that about 40 to about 50%, by weight of the total solution be the monomers.

Any suitable free radical initiator may be used to initiate the polymerization. Suitable classes of such compounds include peroxides and azo compounds. Specific examples include, but are not limited to, benzoyl peroxide, 2,2'-azobisisobutyronitrile, 2,2'-azobis(methylisobutyronitrile), dimethyl 2,2'-azobisisobutyrate and lauroyl peroxide. Suitable initiation concentrations are between about 0.001 to about 5.0% moles of initiator to total moles of monomer. The preferred range of initiator concentration is between about 0.01 to about 3.0% moles of initiator to total moles of monomer. The most preferred range of initiator concentration is between about 0.1 to about 2.0% moles of initiator to total moles of monomer. Initiators should be chosen based on the temperature to be employed in the polymerization.

The alkyl substituted THF of Formula 1 may be substituted up to four times at any position on the tetrahydrofuran ring. Suitable groups for $R^1$, $R^2$, $R^3$ and $R^4$ include hydrogen, methyl, ethyl, propyl, isopropyl, n-butyl, sec-butyl, and t-butyl. The total number of carbons from substituents $R^1$, $R^2$, $R^3$ and $R^4$ should be limited by the boiling point of the tetrahydrofuran derivative and the boiling point of the co-solvent or solvent added after polymerization. It is preferred to maintain the boiling point of the alkyl substituted THF below the boiling point of the co-solvent or solvent added after the polymerization. The preferred total number of carbons from the substituents $R^1$, $R^2$, $R^3$ and $R^4$ is between about 1 to about 6.

Suitable examples of the alkyl substituted THF of Formula 1 include, for example, 2-methyl tetrahydrofuran, 2-ethyl tetrahydrofuran, 3-methyl tetrahydrofuran, 3-ethyl tetrahydrofuran, 2-n-butyl tetrahydrofuran, 3-butyl tetrahydrofuran, 2,2-dimethyl tetrahydrofuran, 3,3-dimethyl tetrahydrofuran, 2-t-butyl tetrahydrofuran, 2,2,5,5-tetramethyl tetrahydrofuran and 2,5-dimethyl tetrahydrofuran.

One or more co-solvents may also be employed in the process of the present invention. Any suitable co-solvent that does not react with the anhydride may be used in the process. Co-solvents useful in the preparation of radiation sensitive coatings are preferred. Examples of preferred co-solvents include propylene glycol methyl ether acetate (PGMEA) and 2-heptanone. PGMEA is a preferred co-solvent.

The alkyl substituted THF of Formula 1 will comprise about 1 to about 100% of the total solvent. In a preferred embodiment, the alkyl substituted THF of Formula 1 will comprise about 5 to about 70% of the total solvent. In a most preferred embodiment, the alkyl substituted THF of Formula 1 will comprise from about 10 to about 50% of the total solvent. In another preferred embodiment the alkyl substituted THF of Formula 1 will comprise about 5 to about 70% of the total solvent and PGMEA will comprise about 30 to about 95% of the total solvent. In another most preferred embodiment, the alkyl substituted THF of Formula 1 will comprise about 10 to about 50% of the total solvent and PGMEA will comprise about 50 to about 90% of the total solvent.

The polymerization may take place at any temperature suitable for the particular reactivity of the monomers and initiators employed that is above the freezing point of the reaction mixture and no more than generally about 10° C. above the boiling point of the lowest boiling monomer or solvent. It is preferred that the polymerization process takes place in the range between about 60 to about 120° C.

The polymerization time may range from about 1 hour to about 2 days. Generally, monomer concentrations are monitored to determine the completion of polymerization. This may vary depending on the monomers employed. Preferred reaction times are from about 4 to about 12 hours.

Polymers useful in photosensitive compositions are preferred to have molecular weights in the range between about 8000 to about 20,000 Daltons with a dispersivity of from about 1 to about 2.6.

After completion of the polymerization, the reaction mixture is distilled to remove residual monomers, the alkyl substituted THF of Formula 1, and any lower boiling volatile reaction products (i.e., having a lower boiling point than any co-solvent employed). If the alkyl substituted THF of Formula 1 is the major portion of the solvent mixture, a higher boiling co-solvent suitable for photosensitive coatings is added such that when distillation is completed, the higher boiling co-solvent will comprise about 50 to about 80% of the remaining material. Distillation may take place at atmospheric pressure or under vacuum. Distillation is continued until only trace amounts of undesired volatiles remain and typically includes distillation some of the higher boiling solvent that is remaining behind.

Preferred copolymers (I) formed by the process of the present invention have the following structural units:

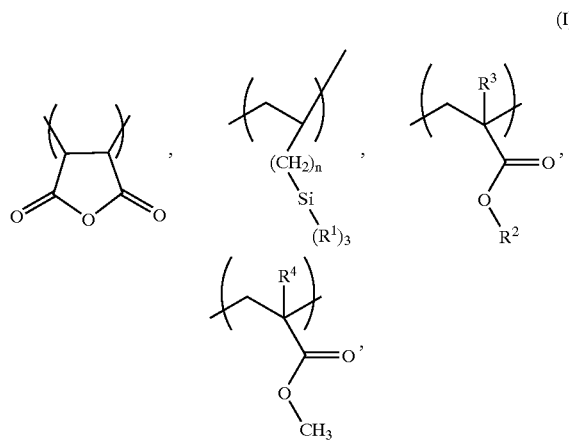

(I)

wherein n is an integer of 1 to 5, $R^1$ is a methyl or trimethylsiloxy group; $R^2$ is a tert-butyl group; and $R^3$ and $R^4$ are each independently selected from hydrogen or a methyl group. Preferably n is equal to 1.

Copolymers (I) are prepared by reacting maleic anhydride, an alkenetrimethylsilane or alkene (tristrimethoxysiloxy) silane, t-butyl acrylate or methacrylate and methyl acrylate or methacrylate in a free radical polymerization reaction to form the novel copolymers.

Copolymer (I) generally comprises about 25 to about 50 mole % maleic anhydride units, about 25 to about 50 mole % alkenetrimethylsilane or alkene(tris trimethylsiloxy) silane units, about 1 to about 40 mole % t-butyl methacrylate or acrylate, and about 1 to about 25 mole % methyl acrylate or methacrylate units. The preferred molecular weight (Mw) of copolymer (I) is about 10,000 to about 40,000, preferably from about 15,000 to about 25,000.

The level of silicon in copolymers (I) will generally be at a level of from about 6 to about 14% by weight, preferably from about 8 to about 12% by weight which is sufficient to allow adequate pattern transfer into the undercoat of the bilayer resist system.

Copolymers (I) are formulated in suitable solvents with photoacid generating (PAG) compounds which generate acid upon exposure to radiation to provide photosensitive photoresist compositions useful in deep UV, particularly 193 nm, photolithography.

A bilayer coated substrate for use in deep UV photolithography is produced by applying a suitable undercoat or planarizing layer to the substrate and then applying onto the undercoated substrate a photoimageable top layer of the photoresist composition of the copolymer (I) described in the previous paragraph. The copolymers (I) provide photoresist compositions suitable for use at 193 and 248 nm wavelength that produce an excellent combination of adhesion, resolution and plasma etch resistance.

Although copolymers (I) can be utilized alone to provide photoresist compositions useful as a photoimageable top coat in a deep UV bilayer photolithography system and provide an excellent combination of adhesion, resolution and plasma etch resistance, it has been discovered that photoresist compositions with a wide variety of minimum rates of dissolution of unexposed photoresist polymer ($R_{min}$) in tetramethyl ammonium hydroxide (TMAH) developer can be provided by a blend of from about 50 to 99 weight %, the foregoing copolymer (I) with from about 1 to about 50 weight % of a novel copolymer (II) which has the following structural units:

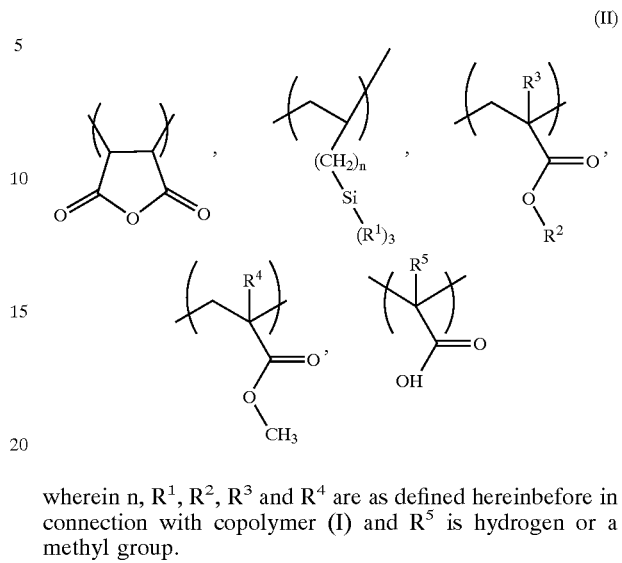

(II)

wherein n, $R^1$, $R^2$, $R^3$ and $R^4$ are as defined hereinbefore in connection with copolymer (I) and $R^5$ is hydrogen or a methyl group.

Copolymer (II) generally comprises from about 25 to about 50 mole % maleic anhydride, about 25 to about 40 mole % alkenetrimethylsilane or alkene(tristrimethylsiloxy) silane, about 1 to about 40 mole % t-butyl methacrylate or acrylate, about 1 to about 25 mole % methyl acrylate or methacrylate, and from about 1 to about 25 mole % acrylic or methacrylic acid. The preferred molecular weight (Mw) of copolymer (II) is about 10,000 to about 40,000, preferably from about 15,000 to about 25,000.

As with copolymers (I), the level of silicon for copolymers (II) will generally be at a level of from about 6 to about 14% by weight, preferably from about 8 to about 12% by weight.

The copolymers (II) are also prepared by free radical polymerization of the maleic anhydride, an alkenetrimethylsilane or alkene(tristrimethylsiloxy)silane, t-butyl acrylate or methacrylate, methyl acrylate or methacrylate and acrylic or methacrylic acid.

A photosensitive photoresist composition can comprise a blend of two separate copolymers where one copolymer has a low $R_{min}$ (i.e., a $R_{min}$ value of less than 1 Å/sec) while the second copolymer has a higher $R_{min}$ (i.e., a $R_{min}$ of 1 Å/sec or more). A copolymer with the low $R_{min}$ is a copolymer (I) and a copolymer with the higher $R_{min}$ is a copolymer (II). These copolymers are compatible and can be blended together to give the desired dissolution characteristics for a particular photoresist composition. The blend of copolymers can comprise from about 50 to about 99 weight % copolymer (I) and from about 1 to about 50 weight % copolymer (II), preferably from about 80 to about 90 weight percent copolymer (I) and from about 10 to about 20 weight percent copolymer (II), based on the total weight of the two copolymers.

The present invention is further illustrated by the following examples.

COMPARATIVE EXAMPLE 1

Synthesis of Poly (allyltrimethylsilane-co-maleic anhydride-co-t-butyl acrylate-co-methyl acrylate) via tetrahydrofuran: (Polymer SE-1)

In a 10 L five neck jacketed reactor equipped with two temperature probes, a mechanical stirrer, a condenser and a closed sampling adapter was combined maleic anhydride (1287.33 g, 13.128 mol), allyltrimethylsilane (1500 g, 13.128 mol), t-butyl acrylate (1278.78 g, 9.977 mol), methyl acrylate (305.15 g, 3.545 mol) and THF (2866.77 g). The mixture was stirred under a $N_2$ atmosphere until all the maleic anhydride was dissolved. The mixture was heated with stirring to 72° C. using a heater/chiller and 2,2'-azobis (2-methylbutyronitrile) (27.20 g, 0.142 mol) dissolved in THF (27.20 g) was added. The reaction mixture was stirred for 16–20 hours until all maleic anhydride monomer was consumed. The resulting polymer solution was cooled to room temperature then precipitated in hexanes (15.0 L) in a 20 L jacketed reactor over one hour. The polymer solids were filtered through a Buchner funnel and washed with fresh hexanes (3 L). The polymer solid was then dried overnight in a vacuum oven at 70° C. The dried polymer was dissolved in THF (4106 g) and again precipitated in hexanes (15 L), filtered through a Buchner funnel and washed with fresh hexanes (3 L). The polymer was dried in a vacuum oven at 70° C. for 48 hours. The polymer was dissolved in PGMEA and adjusted to a 40 wt % solution.

Analyticals: $^1$H NMR of dried polymer (CDCl$_3$, Benzoic acid as internal standard, 400 MHz): 29 mol % allyltrimethylsilane, 26 mol % t-butyl acrylate, 8 mol % methyl acrylate, 37 mol % maleic anhydride. GPC (Waters Corp. liquid chromatograph [refractive index detection, Millenium GPC V software, Phenogel-10, 7.8×250 mm column: 10$^4$ Å, 500 Å, 50 Å & 10 Å, THF effluent]): Mw=16,019; Polydispersity=1.97. Acidity (due to opened maleic anhydride): <0.5 wt % acrylic acid. Trace Metals: 5208 ppb Ca, 136 ppb Cr, <50 ppb Cu, <50 ppb Fe, 68 ppb Mg, 224 ppb Mn, 76 ppb Zn, 65 ppb K and 124 ppb Na. Over a 10 batch history trace amounts of calcium ranged from 200 to 6000 ppb.

COMPARATIVE EXAMPLE 2

Synthesis of Poly (allyltrimethylsilane-co-maleic anhydride-co-t-butyl acrylate-co-methyl acrylate) via propylene glycol methyl ether acetate: (Polymer SE-3)

In a 100 mL, round-bottom, three-necked flask equipped with a condenser, a magnetic stir bar and a sampling adapter was combined maleic anhydride (10.30 g, 0.1050 mol), allyltrimethylsilane (12.00 g, 0.1050 mol), t-butyl acrylate (10.20 g, 0.0796 mol), methyl acrylate (2.47 g, 0.0286 mol) and PGMEA (48.76 g). The mixture was stirred under a $N_2$ atmosphere until all the maleic anhydride was dissolved. The mixture was heated with stirring to 72° C. using an oil bath and 2,2'-azobis(2-methylbutyronitrile) (0.5608 g, 2.9 mmol) dissolved in PGMEA (2.0 g) was added. The solution was stirred for 20 hours. The solution was allowed to cool to room temperature and PGMEA (50 mL) was added. The polymer solution was vacuum distilled at 60° C. to a final weight of 77.8 g.

Analyticals: GPC (Waters Corp. liquid chromatograph [refractive index detection, Millenium GPC V software, Phenogel-10, 7.8×250 mm column: 10$^4$ Å, 500 Å, 50 Å & 10 Å, THF effluent]): Mw=31,000; Polydispersity=2.87.

The molecular weight of the resulting polymer could not be controlled below 31,000 Daltons.

COMPARATIVE EXAMPLE 3

Synthesis of Poly (allyltrimethylsilane-co-maleic anhydride-co-t-butyl acrylate-co-methyl acrylate) via propylene glycol methyl ether acetate and carbon tetrabromide: (Polymer SE-4)

In a 100 mL, round-bottom, three-necked flask equipped with a temperature probe, a magnetic stir bar and closed vacuum adapter was combined maleic anhydride (7.38 g, 0.0753 mol), allyltrimethylsilane (8.58 g, 0.751 mol), t-butyl acrylate (7.30 g, 0.0570 mol), methyl acrylate (2.13 g, 0.0247 mol) and propylene glycol monomethyl ether acetate (PGMEA, 33.86 g). The mixture was stirred under a $N_2$ atmosphere until all the maleic anhydride was dissolved. To this solution was added carbon tetrabromide (CBr$_4$, 0.39 g) as a chain transfer agent. The mixture was heated with stirring to 68° C. using a heating mantle and 2,2'-azobis(2-methylbutyronitrile) (1.32 g, 6.87 mmol) dissolved in PGMEA (2.0 g) was added dropwise over 20 minutes. The temperature was increased to 72° C. and stirred for 21 hours. The solution was allowed to cool to room temperature and hexane (250 mL) was added to separate monomer and oligomers from polymer by decantation. PGMEA (55.38 g) was added and vacuum distilled to 27% solution by weight.

Analyticals: $^1$H NMR of PGMEA solution (CDCl$_3$, Benzoic acid as internal standard, 400 MHz): 27 wt % allyltrimethylsilane and 27 wt % t-butyl acrylate. GPC (Waters Corp. liquid chromatograph [refractive index detection, Millenium GPC V software, Phenogel-10, 7.8×250 mm column: 10$^4$ Å, 500 Å, 50 Å & 10 Å, THF effluent]): Mw=22,491; Polydispersity=2.63.

It may be possible to control molecular weight below 20,000 Daltons, but the polydispersity will be higher than SE-1. Moreover, it is possible to introduce bromine contamination.

COMPARATIVE EXAMPLE 4

Synthesis of Poly (allyltrimethylsilane-co-maleic anhydride-co-t-butyl acrylate-co-methyl acrylate) via propylene glycol methyl ether acetate and tetrahydrofuran (50:50): (Polymer SE-5)

In a 100 mL, round-bottom, three-necked flask equipped with a temperature probe, a magnetic stir bar and closed stopcock adapter was combined maleic anhydride (8.88 g, 0.0906 mol), allyltrimethylsilane (10.30 g, 0.0901 mol), t-butyl acrylate (8.75 g, 0.0683 mol), methyl acrylate (2.13 g, 0.0247 mol), PGMEA (21.11 g) and THF (21.05 g). The mixture was stirred under a $N_2$ atmosphere until all the maleic anhydride was dissolved. The mixture was heated with stirring to 68° C. using a heating mantle and 2,2'-azobis (2-methylbutyronitrile) (0.20 g, 1.04 mmol) dissolved in PGMEA (1.50 g) and THF (1.50 g) was added dropwise over one minute. After the temperature stabilized, it was then increased to 72° C. and stirred for 22 hours.

Analyticals: $^1$H NMR of sample precipitated in hexane (CDCl$_3$, Benzoic acid as internal standard, 400 MHz): 27 mol % allyltrimethylsilane, 22 mol % t-butyl acrylate, 8 mol % methyl acrylate, 42 mol % maleic anhydride. GPC (Waters Corp. liquid chromatograph [refractive index detection, Millenium GPC V software, Phenogel-10, 7.8× 250 mm column: 10$^4$ Å, 500 Å, 50 Å & 10 Å, THF effluent]): Mw=12,105; Polydispersity=2.43.

The incorporation of the lower reactivity monomer, allyltrimethylsilane, could not be controlled to match the targeted polymer. In addition, the reaction time was not improved.

COMPARATIVE EXAMPLE 5

Synthesis of Poly (allyltrimethylsilane-co-maleic anhydride-co-t-butyl acrylate-co-methyl acrylate) via tetrahydropyran: (Polymer SE-6)

In a 100 mL, round-bottom, three-necked flask equipped with a temperature probe, a magnetic stir bar and a sampling adapter was combined maleic anhydride (8.86 g, 0.0904 mol), allyltrimethylsilane (10.33 g, 0.0904 mol), t-butyl acrylate (8.76 g, 0.0683 mol), methyl acrylate (2.12 g, 0.0246 mol) and THP (42.99 g). The mixture was stirred under a $N_2$ atmosphere until all the maleic anhydride was dissolved. The mixture was heated with stirring to 68° C.

using a heating mantle and 2,2'-azobis(2-methylbutyronitrile) (0.53 g, 2.8 mmol) dissolved in THP (2.05 g) was added dropwise over one minute. After the temperature stabilized, it was then increased to 72° C. and stirred for 19 hours.

Analyticals: $^1$H NMR of sample precipitated in hexane and vacuum dried at 60° C. for 3 hours (CDCl$_3$, Benzoic acid as internal standard, 400 MHz): 30 mol % allyltrimethylsilane, 27 mol % t-butyl acrylate, 11 mol % methyl acrylate, 32 mol % maleic anhydride. GPC (Waters Corp. liquid chromatograph [refractive index detection, Millenium GPC V software, Phenogel-10, 7.8×250 mm column: 10$^4$ Å, 500 Å, 50 Å & 10 Å, THF effluent]): Mw=20365; Polydispersity=2.45.

THP is a higher boiling solvent similar to THF in structure and polarity that might be considered to solve some of the issues of using THF. However, the polymerization requires additional solvent and initiator to control the molecular weight below 20,000 Daltons compared to a tetrahydrofuran process. This would result in lower amounts of polymer per batch. In addition, polymerization time is not significantly reduced.

COMPARATIVE EXAMPLE 6

Synthesis of Poly (allyltrimethylsilane-co-maleic anhydride-co-t-butyl acrylate-co-3-(3,5,7,9,11,13,15-heptaethylpentacyclo[9.5.1.1$^{3,9}$.1$^{5,15}$.1$^{7,13}$]octa-siloxan-1-yl)propyl methacrylate) via tetrahydrofuran: (Polymer SE-13)

In a 250 mL three neck flask equipped with a temperature probes, a magnetic stirrer, a condenser and a closed sampling adapter was combined maleic anhydride (4.48 g, 0.04569 mol), allyltrimethylsilane (5.22 g, 0.04569 mol), t-butyl acrylate (5.14 g, 0.04010 mol), 3-(3,5,7,9,11,13,15-heptaethylpentacyclo[9.5.1.1$^{3,9}$.1$^{5,15}$.1$^{7,13}$]octa-siloxan-1-yl)propyl methacrylate or methacrylethyl-POSS (5.17 g, 0.00692 mol) and THF (30 g). The mixture was stirred under a N$_2$ atmosphere until all the maleic anhydride was dissolved. The mixture was heated with stirring to 65° C. using a heater/chiller and dimethyl 2,2'-azobis(2-methylpropionate) (0.105 g, 0.00046 mol) was added. The reaction mixture was heated to 68° C. and left stirring for 19 hours until all maleic anhydride monomer was consumed. The resulting polymer solution was cooled to room temperature then polymer solution was distilled with excess PGMEA (37 g) at 60° C. under vacuum to remove MeTHF and unconverted monomers azeotropically with PGMEA to approximately 40% solution by weight with PGMEA. The polymer solution was cooled to room temperature. Analyticals: GPC (Waters Corp. liquid chromatograph [refractive index detection, Millenium GPC V software, Phenogel-10, 7.8×250 mm column: 10$^4$ Å, 500 Å, 50 Å & 10 Å, THF effluent]): Mw=9,500; Polydispersity=2.6.

The polymerization time and solvent are not ideal for an industrial scale up. The next example explores the use of propylene glycol methyl ether acetate as the polymerization solvent since it has a high boiling point.

COMPARATIVE EXAMPLE 7

Synthesis of Poly (allyltrimethylsilane-co-maleic anhydride-co-t-butyl acrylate-co-3-(3,5,7,9,11,13,15-heptaethylpentacyclo[9.5.1.1$^{3,9}$.1$^{5,15}$.1$^{7,13}$]octa-siloxan-1-yl)propyl methacrylate) via propylene glycol methyl ether acetate: (Polymer SE-14)

In a 100 mL three neck flask equipped with a temperature probes, a magnetic stirrer, a condenser and a closed sampling adapter was combined maleic anhydride (4.48 g, 0.04569 mol), allyltrimethylsilane (5.22 g, 0.04569 mol), t-butyl acrylate (5.14 g, 0.04010 mol), 3-(3,5,7,9,11,13,15-heptaethylpentacyclo[9.5.1.1$^{3,9}$.1$^{5,15}$.1$^{7,13}$]octa-siloxan-1-yl)propyl methacrylate or methacrylethyl-POSS (5.17 g, 0.00692 mol) and PGMEA (32 g). The mixture was stirred under a N$_2$ atmosphere until all the maleic anhydride was dissolved. The mixture was heated with stirring to 65° C. using a heater/chiller and dimethyl 2,2'-azobis(2-methylpropionate) (0.105 g, 0.00046 mol) was added. The reaction mixture was heated to 73° C. and left stirring for 42 hours at which time unconverted maleic anhydride remained.

Analyticals: GPC (Waters Corp. liquid chromatograph [refractive index detection, Millenium GPC V software, Phenogel-10, 7.8×250 mm column: 10$^4$ Å, 500 Å, 50 Å & 10 Å, THF effluent]): Mw=38,000; Polydispersity=2.5.

Residual monomer was still present after 42 hours indicating incomplete reaction.

COMPARATIVE EXAMPLE 8

Synthesis of Poly (allyltrimethylsilane-co-maleic anhydride-co-t-butyl acrylate-co-methyl acrylate) via tetrahydrofuran and Solvent Exchange to propylene glycol methyl ether acetate: (Polymer SE-2)

In a 2 L four neck jacketed reactor equipped with a temperature probe, a mechanical stirrer, a condenser and a closed sampling adapter was combined maleic anhydride (128.73 g, 1.3128 mol), allyltrimethylsilane (150.0 g, 1.3128 mol), t-butyl acrylate (127.83 g, 0.9977 mol), methyl acrylate (30.52 g, 0.3545 mol) and THF (286.7 g). The mixture was stirred under a N$_2$ atmosphere until all the maleic anhydride was dissolved. The mixture was heated with stirring to 72° C. using a heater/chiller and 2,2'-azobis(2-methylbutyronitrile) (2.59 g, 0.0135 mol) dissolved in THF (2.59 g) was added. The reaction mixture was stirred for 16–24 hours until all maleic anhydride monomer was consumed. The resulting polymer solution was cooled to room temperature then PGMEA (726 g) was added. The solution was heated to 60° C. under vacuum to azeotropically distill THF, PGMEA and unconverted monomer (615 g) into a 1 L receiving flask. Once polymer solution was cooled to room temperature, PGMEA was added to adjust the amount of polymer in solution to 40% by weight.

Analyticals: $^1$H NMR of PGMEA solution (CDCl$_3$, Benzoic acid as internal standard, 400 MHz): 43 wt % polymer in solution, 30 wt % allyltrimethylsilane and 30 mol % t-butyl acrylate. GPC (Waters Corp. liquid chromatograph [refractive index detection, Millenium GPC V software, Phenogel-10, 7.8×250 mm column: 10$^4$ Å, 500 Å, 50 Å & 10 Å, THF effluent]): Mw=15,416. Acidity (due to opened maleic anhydride): 0.2 wt % acrylic acid for total solution. Trace Metals of PGMEA solution: <10 ppb Ca, <10 ppb Cr, <10 ppb Co, <10 ppb Cu, 15 ppb Fe, <10 ppb Mg, <10 ppb Mn, <10 ppb Ti, 11 ppb Zn and 53 ppb Na.

This experiment showed that replacing the isolation step with a solvent exchange/distillation step with PGMEA could be carried out without problem to yield lower trace metal polymer solutions. This would reduce the cycle time, energy costs, and eliminate the use of hexanes resulting in a more cost efficient process better for the environment. However, issues with the use of THF would still remain.

Example 1

Synthesis of Poly (allyltrimethylsilane-co-maleic anhydride-co-t-butyl acrylate-co-methyl acrylate) via 2-methyltetrahydrofuran: (Polymer SE-7)

In a 250 mL, round-bottom, three-necked flask equipped with a temperature probe, a magnetic stir bar and closed stopcock adapter was combined maleic anhydride (17.77 g, 0.1812 mol), allyltrimethylsilane (20.67 g, 0.1809 mol), t-butyl acrylate (17.53 g, 0.1368 mol), methyl acrylate (4.27 g, 0.0496 mol) and MeTHF (88.00 g). The mixture was stirred under a $N_2$ atmosphere until all the maleic anhydride was dissolved. The mixture was heated with stirring to 68° C. using a heating mantle and 2,2'-azobis(2-methylbutyronitrile) (1.11 g, 5.8 mmol) dissolved in MeTHF (1.99 g) was added dropwise over one minute. After the temperature stabilized, it was then increased to 72° C. and stirred for 5 hours.

Analyticals: $^1$H NMR of sample precipitated in hexane (CDCl$_3$, Benzoic acid as internal standard, 400 MHz): 30 mol % allyltrimethylsilane, 25 mol % t-butyl acrylate, 8 mol % methyl acrylate, 37 mol % maleic anhydride. GPC (Waters Corp. liquid chromatograph [refractive index detection, Millenium GPC V software, Phenogel-10, 7.8×250 mm column: $10^4$ Å, 500 Å, 50 Å & 10 Å, THF effluent]): Mw=3894; Polydispersity=2.42.

2-Methyltetrahydrofuran (MeTHF, bp 78–80° C., Fp –11° C.) was considered as another candidate to replace THF. Unexpectedly, the polymerization time was greatly reduced, although the molecular weight was too low at this concentration. However, being able to use a higher monomer content was also an unexpected advantage and would increase the amount of polymer produced per batch. In addition, incorporation of the low reactivity monomer, allyl trimethylsilane was excellent.

Example 2

Synthesis of Poly (allyltrimethylsilane-co-maleic anhydride-co-t-butyl acrylate-co-methyl acrylate) via 2-methyltetrahydrofuran: (Polymer SE-8)

In a 250 mL, round-bottom, three-necked flask equipped with a temperature probe, a magnetic stir bar and closed stopcock adapter was combined maleic anhydride (26.56 g, 0.2709 mol), allyltrimethylsilane (30.99 g, 0.2712 mol), t-butyl acrylate (26.29 g, 0.2051 mol), methyl acrylate (6.39 g, 0.0742 mol) and MeTHF (58.05 g). The mixture was stirred under a $N_2$ atmosphere until all the maleic anhydride was dissolved. The mixture was heated with stirring to 68° C. using a heating mantle and 2,2'-azobis(2-methylbutyronitrile) (1.59 g, 8.3 mmol) dissolved in MeTHF (2.08 g) was added dropwise over one minute. When temperature stabilized the temperature was increased to 72° C. and stirred for 3 hours.

Analyticals: GPC (Waters Corp. liquid chromatograph [refractive index detection, Millenium GPC V software, Phenogel-10, 7.8×250 mm column: $10^4$ Å, 500 Å, 50 Å & 10 Å, THF effluent]): Mw=8557; Polydispersity=2.09.

The molecular weight was significantly improved and within the target MW range and polydispersivity, although below the specific target polymer of SE-1. However, being able to use a higher monomer content will increase the amount of polymer produced per batch. The decreased reaction time and the incorporation of the low reactivity monomer were maintained.

Example 3

Synthesis of Poly (allyltrimethylsilane-co-maleic anhydride-co-t-butyl acrylate-co-methyl acrylate) via propylene glycol methyl ether acetate and 2-methyltetrahydrofuran (50:50): (Polymer SE-9)

In a 250 mL, round-bottom, three-necked flask equipped with a temperature probe, a magnetic stir bar, and a sampling adapter was combined maleic anhydride (26.57 g, 0.2710 mol), allyltrimethylsilane (30.89 g, 0.2703 mol), t-butyl acrylate (26.25 g, 0.2048 mol), methyl acrylate (6.57 g, 0.0763 mol), PGMEA (30.01 g) and MeTHF (27.99 g). The mixture was stirred under a $N_2$ atmosphere until all the maleic anhydride was dissolved. The mixture was heated with stirring to 68° C. using a heating mantle and 2,2'-azobis(2-methylbutyronitrile) (1.59 g, 8.3 mmol) dissolved in MeTHF (2.18 g) was added dropwise over one minute. After the temperature stabilized, it was then increased to 72° C. and stirred for 5 hours.

Analyticals: $^1$H NMR of sample precipitated in hexane and vacuum dried at 60° C. for 3 hours (CDCl$_3$, Benzoic acid as internal standard, 400 MHz): 31 mol % allyltrimethylsilane, 27 mol % t-butyl acrylate, 10 mol % methyl acrylate, 32 mol % maleic anhydride. GPC (Waters Corp. liquid chromatograph [refractive index detection, Millenium GPC V software, Phenogel-10, 7.8×250 mm column: $10^4$ Å, 500 Å, 50 Å & 10 Å, THF effluent]): Mw=12,105; Polydispersity=2.30.

The solvent blend helped to improve the MW while maintaining incorporation of the low reactivity monomer allyl trimethyl silane and a short reaction time.

Example 4

Synthesis of Poly (allyltrimethylsilane-co-maleic anhydride-co-t-butyl acrylate-co-methyl acrylate) via propylene glycol methyl ether acetate and 2-methyltetrahydrofuran (80:20): (Polymer SE-10)

In a 250 mL, round-bottom, three-necked flask equipped with a temperature probe, a magnetic stir bar, and a sampling adapter was combined maleic anhydride (17.76 g, 0.1811 mol), allyltrimethylsilane (20.62 g, 0.1805 mol), t-butyl acrylate (17.52 g, 0.1367 mol), methyl acrylate (4.32 g, 0.0502 mol), PGMEA (72.00 g) and MeTHF (16.01 g). The mixture was stirred under a $N_2$ atmosphere until all the maleic anhydride was dissolved. The mixture was heated with stirring to 68° C. using a heating mantle and 2,2'-azobis(2-methylbutyronitrile) (1.10 g, 5.7 mmol) dissolved in MeTHF (2.0 g) was added dropwise over one minute. After the temperature stabilized, it was then increased to 72° C. and stirred for 5 hours.

Analyticals: $^1$H NMR of sample precipitated in hexane and vacuum dried at 60° C. for 3 hours (CDCl$_3$, Benzoic acid as internal standard, 400 MHz): 34 mol % allyltrimethylsilane, 28 mol % t-butyl acrylate, 10 mol % methyl acrylate, 28 mol % maleic anhydride. GPC (Waters Corp. liquid chromatograph [refractive index detection, Millenium GPC V software, Phenogel-10, 7.8×250 mm column: $10^4$ Å, 500 Å, 50 Å & 10 Å, THF effluent]): Mw=13,980; Polydispersity=2.31.

The solvent blend helped to improve the MW while maintaining incorporation of the low reactivity monomer allyl trimethyl silane and a short reaction time.

Example 5

Synthesis of Poly (allyltrimethylsilane-co-maleic anhydride-co-t-butyl acrylate-co-methyl acrylate) via propylene glycol methyl ether acetate and 2-methyltetrahydrofuran (90:10): (Polymer SE-11)

In a 2 L, round-bottom, three-necked, jacketed flask equipped with a temperature probe, a mechanical stirrer, a condenser and a sampling adapter was combined maleic anhydride (141.4 g, 1.4420 mol), allyltrimethylsilane (165.4 g, 1.4476 mol), t-butyl acrylate (139.9 g, 1.0915 mol), methyl acrylate (33.8 g, 0.3926 mol), PGMEA (648.0 g) and MeTHF (67.9 g). The mixture was stirred under a $N_2$ atmosphere until all the maleic anhydride was dissolved. The mixture was heated with stirring to 70° C. using a heater/chiller and 2,2'-azobis(2-methylbutyronitrile) (8.45 g, 0.0439 mol) dissolved in MeTHF (5.0 g) was added dropwise over one minute. After the temperature stabilized, it was then increased to 72° C. and stirred for 6 hours. The polymer was purified in two different ways: half of the polymer solution was distilled and half of the polymer solution was precipitated twice.

Distillation: In a 1 L three neck, round bottom flask, the polymer solution (616.5 g) was transferred for distillation. PGMEA (104 g) was added and the solution was heated to 60° C. under vacuum and azeotropically distilled to 508.0 g solution.

Analyticals: $^1$H NMR of PGMEA solution (CDCl$_3$, Benzoic acid as internal standard, 400 MHz): 42.7 wt % polymer in solution, 33 wt % allyltrimethylsilane and 30 wt % t-butyl acrylate. GPC (Waters Corp. liquid chromatograph [refractive index detection, Millenium GPC V software, Phenogel-10, 7.8×250 mm column: $10^4$ Å, 500 Å, 50 Å & 10 Å, THF effluent]): Mw=17793; Polydispersity=2.26. Acidity (due to opened maleic anhydride): 0.2 wt % acrylic acid for total solution.

Precipitation: The polymer solution (581.1 g) diluted with PGMEA (50.7 g) was precipitated in hexane (3.6 L) in a 5 L three neck round bottom flask. The supernatant hexane solution was decanted and THF (500 mL) was added to dissolve the polymer solids. The polymer solution was precipitated in fresh hexanes (5 L) and filtered through a Buchner funnel. The polymer was dried in a vacuum oven at 65° C. for 24 hours.

Analyticals: $^1$H NMR of dried polymer (CDCl$_3$, Benzoic acid as internal standard, 400 MHz): 31 mol % allyltrimethylsilane, 25 mol % t-butyl acrylate, 8 mol % methyl acrylate and 36 mol % maleic anhydride. GPC (Waters Corp. liquid chromatograph [refractive index detection, Millenium GPC V software, Phenogel-10, 7.8× 250 mm column: $10^4$ Å, 500 Å, 50 Å & 10 Å, THF effluent]): Mw=18599; Polydispersity=2.04.

The solvent blend helped to improve the MW while maintaining incorporation of the low reactivity monomer allyl trimethyl silane and a short reaction time. The distillation process produced polymer similar to SE-1.

Example 6

Synthesis of Poly (allyltrimethylsilane-co-maleic anhydride-co-t-butyl acrylate-co-methyl acrylate) via propylene glycol methyl ether acetate and 2-methyltetrahydrofuran: (Polymer SE-12)

In a 10 L five neck jacketed reactor equipped with two temperature probes, a mechanical stirrer, a condenser and a closed sampling adapter was combined maleic anhydride (965.48 g, 9.846 mol), allyltrimethylsilane (1125 g, 9.846 mol), t-butyl acrylate (958.73 g, 7.4828 mol), methyl acrylate (228.90 g, 2.6588 mol) PGMEA (3900 g) and MeTHF (989.25 g). The mixture was stirred under a N$_2$ atmosphere until all the maleic anhydride was dissolved. The mixture was heated with stirring to 72° C. using a heater/chiller and 2,2'-azobis(2-methylbutyronitrile) (57.38 g, 0.142 mol) dissolved in PGMEA (57.38 g) was added. The reaction mixture was stirred for 14 hours until all maleic anhydride monomer was consumed. The resulting polymer solution was cooled to room temperature then polymer solution was distilled at 60° C. under vacuum to remove MeTHF and unconverted monomers azeotropically with PGMEA (2250 g solution removed). The polymer solution was cooled to room temperature and adjusted to 40% solution by weight with PGMEA.

Analyticals: $^1$H NMR of PGMEA solution (CDCl$_3$, Benzoic acid as internal standard, 400 MHz): 42.6 wt % polymer in solution, 31 wt % allyltrimethylsilane and 27 wt % t-butyl acrylate. $^1$H NMR of sample precipitated in hexane and vacuum dried at 60° C. for 3 hours (CDCl$_3$, Benzoic acid as internal standard, 400 MHz): 31 mol % allyltrimethylsilane, 27 mol % t-butyl acrylate, 9 mol % methyl acrylate, 33 mol % maleic anhydride. GPC (Waters Corp. liquid chromatograph [refractive index detection, Millenium GPC V software, Phenogel-10, 7.8×250 mm column: $10^4$ Å, 500 Å, 50 Å & 10 Å, THF effluent]): Mw=11,815; Polydispersity= 2.35. Trace Metals: <5 ppb Ca, <10 ppb Cr, <10 ppb Co, 12 ppb Cu, 17 ppb Fe, 17 ppb Mg, <10 ppb Mn, <10 ppb Ti, 23 ppb Zn, 11 ppb K and 17 ppb Na.

The next examples utilize 2-methyltetrahydrofuran as a cosolvent with propylene glycol methyl ether acetate to reduce polymerization time.

Example 7

Synthesis of Poly (allyltrimethylsilane-co-maleic anhydride-co-t-butyl acrylate-co-3-(3,5,7,9,11,13,15-heptaethylpentacyclo[9.5.1.1$^{3,9}$.1$^{5,15}$.1$^{7,13}$]octa-siloxan-1-yl)propyl methacrylate) via propylene glycol methyl ether acetate and 2-methyl tetrahydrofuran (50:50): (Polymer SE-15)

In a 100 mL three neck flask equipped with a temperature probes, a magnetic stirrer, a condenser and a closed sampling adapter was combined maleic anhydride (4.48 g, 0.04569 mol), allyltrimethylsilane (5.22 g, 0.04569 mol), t-butyl acrylate (5.14 g, 0.04010 mol), 3-(3,5,7,9,11,13,15-heptaethylpentacyclo[9.5.1.1$^{3,9}$.1$^{5,15}$.1$^{7,13}$]octa-siloxan-1-yl)propyl methacrylate or methacrylethyl-POSS (5.17 g, 0.00692 mol), PGMEA (15 g) and MeTHF (15 g). The mixture was stirred under a N$_2$ atmosphere until all the maleic anhydride was dissolved. The mixture was heated with stirring to 65° C. using a heater/chiller and dimethyl 2,2'-azobis(2-methylpropionate) (0.105 g, 0.00046 mol) was added. The reaction mixture was heated to 72° C. and left stirring for 25 hours until all maleic anhydride monomer was consumed. The resulting polymer solution was cooled to room temperature then polymer solution was distilled with excess PGMEA (37 g) at 60° C. under vacuum to remove MeTHF and unconverted monomers azeotropically with PGMEA to approximately 40% solution by weight with PGMEA. The polymer solution was cooled to room temperature.

Analyticals: $^1$H NMR of film made from PGMEA solution (CDCl$_3$, Benzoic acid as internal standard, 400 MHz): 5 mol % methacrylethyl-POSS, 23 mol % allyltrimethylsilane, 35 mol % t-butyl acrylate and 37 mol % maleic anhydride. GPC (Waters Corp. liquid chromatograph [refractive index detection, Millenium GPC V software, Phenogel-10, 7.8×250 mm column: $10^4$ Å, 500 Å, 50 Å & 10 Å, THF effluent]): Mw=8500; Polydispersity=2.5.

Polymerization was complete in 25 hours. Molecular weight is 8500.

Example 8

Synthesis of Poly (allyltrimethylsilane-co-maleic anhydride-co-t-butyl acrylate-co-3-(3,5,7,9,11,13,15-heptaethylpentacyclo[9.5.1.1$^{3,9}$.1$^{5,15}$.1$^{7,13}$]octa-siloxan-1-yl)propyl methacrylate) via propylene glycol methyl ether acetate and 2-methyl tetrahydrofuran (60:40): (Polymer SE-16)

In a 100 mL three neck flask equipped with a temperature probes, a magnetic stirrer, a condenser and a closed sampling adapter was combined maleic anhydride (4.48 g, 0.04569 mol), allyltrimethylsilane (5.22 g, 0.04569 mol), t-butyl acrylate (5.14 g, 0.04010 mol), 3-(3,5,7,9,11,13,15-heptaethylpentacyclo[9.5.1.1$^{3,9}$.1$^{5,15}$.1$^{7,13}$]octa-siloxan-1-yl)propyl methacrylate or methacrylethyl-POSS (5.17 g, 0.00692 mol), PGMEA (18 g) and MeTHF (12 g). The mixture was stirred under a N$_2$ atmosphere until all the maleic anhydride was dissolved. The mixture was heated with stirring to 65° C. using a heater/chiller and dimethyl 2,2'-azobis(2-methylpropionate) (0.16 g, 0.00069 mol) was added. The reaction mixture was heated to 75° C. and left stirring for 10 hours until all maleic anhydride monomer was consumed.

Analyticals: $^1$H NMR of film made from PGMEA solution (CDCl$_3$, Benzoic acid as internal standard, 400 MHz): 6 mol % methacrylethyl-POSS, 30 mol % allyltrimethylsilane, 32 mol % t-butyl acrylate and 32 mol % maleic anhydride. GPC (Waters Corp. liquid chromatograph [refractive index detection, Millenium GPC V software, Phenogel-10, 7.8×250 mm column: $10^4$ Å, 500 Å, 50 Å & 10 Å, THF effluent]): Mw=8500; Polydispersity=2.5.

Polymerization was complete in 9 hours. Molecular weight is 8500.

Example 9
Synthesis of Poly (allyltrimethylsilane-co-maleic anhydride-co-t-butyl acrylate-co-3-(3,5,7,9,11,13,15-heptaethylpentacyclo[9.5.1.1$^{3,9}$.1$^{5,15}$.1$^{7,13}$]octa-siloxan-1-yl)propyl methacrylate) via propylene glycol methyl ether acetate and 2-methyl tetrahydrofuran (60:40 (Polymer SE-17)

In a 100 mL three neck flask equipped with a temperature probes, a magnetic stirrer, a condenser and a closed sampling adapter was combined maleic anhydride (4.48 g, 0.04569 mol), allyltrimethylsilane (5.22 g, 0.04569 mol), t-butyl acrylate (5.14 g, 0.04010 mol), 3-(3,5,7,9,11,13,15-heptaethylpentacyclo[9.5.1.1$^{3,9}$.1$^{5,15}$.1$^{7,13}$]octa-siloxan-1-yl)propyl methacrylate or methacrylethyl-POSS (5.17 g, 0.00692 mol), PGMEA (12 g) and MeTHF (8 g). The mixture was stirred under a N$_2$ atmosphere until all the maleic anhydride was dissolved. The mixture was heated with stirring to 65° C. using a heater/chiller and dimethyl 2,2'-azobis(2-methylpropionate) (0.16 g, 0.00069 mol) was added. The reaction mixture was heated to 75° C. and left stirring for 10 hours until all maleic anhydride monomer was consumed. The resulting polymer solution was cooled to room temperature then polymer solution was distilled with excess PGMEA (37 g) at 60° C. under vacuum to remove MeTHF and unconverted monomers azeotropically with PGMEA to approximately 40% solution by weight with PGMEA. The polymer solution was cooled to room temperature.

Analyticals: $^1$H NMR of film made from PGMEA solution (CDCl$_3$, Benzoic acid as internal standard, 400 MHz): 5 mol % methacrylethyl-POSS, 27 mol % allyltrimethylsilane, 30 mol % t-butyl acrylate and 38 mol % maleic anhydride. GPC (Waters Corp. liquid chromatograph [refractive index detection, Millenium GPC V software, Phenogel-10, 7.8×250 mm column: $10^4$ Å, 500 Å, 50 Å & 10 Å, THF effluent]): Mw=13500; Polydispersity=2.9

Polymerization was complete in 9 hours. Molecular weight is 13500.

The above examples show that a process using PGMEA and MeTHF allow for shorter polymerization times that can be tailored for different molecular weights.

The combination of the solvent blend polymerization procedure and the distillation procedure successfully produced a polymer solution of a desired composition within the desired MW and polydispersivity ranges having low trace metals and utilizing a smaller total amount of solvent for the entire process.

While we have shown and described several embodiments in accordance with our invention, it is to be clearly understood that the same are susceptible to numerous changes and modifications apparent to one skilled in the art. Therefore, we do not wish to be limited to the details shown and described but intend to show all changes and modifications which come within the scope of the appended claims.

What is claimed is:

1. In a polymerization process for preparing anhydride-containing polymers from a reaction mixture of monomers in a solvent and a free radical initiator, the improvement comprising employing as a solvent a alkyl-substituted tetrahydrofuran solvent of the formula 1:

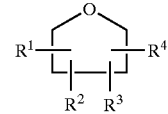

Formula 1 where $R^1$, $R^2$, $R^3$, and $R^4$ are independently chosen from the group consisting of hydrogen and $C_1$–$C_4$ linear or branched alkyl with the proviso that at least one of $R^1$, $R^2$, $R^3$, and $R^4$ is not H.

2. The polymerization process of claim 1 wherein the alkyl-substituted tetrahydrofuran solvent is methyltetrahydrofuran.

3. The polymerization process of claim 1 wherein a co-solvent is also present in the reaction mixture.

4. The polymerization process of claim 2 wherein a co-solvent is also present in the reaction.

5. The polymerization process of claim 4 wherein the co-solvent is propylene glycol methyl ether acetate.

6. The polymerization process of claim 1 wherein the monomers in the reaction are maleic anhydride, allyltrimethylsilane, t-butyl acrylate and methyl acrylate.

7. The polymerization process of claim 1 wherein the monomers in the reaction are maleic anhydride, allyltrimethylsilane, t-butyl acrylate and 3-(3,5,7,9,11,13,15-heptaethylpentacyclo [9.5.1.1$^{3,9}$.1$^{5,15}$.1$^{7,13}$]octa-siloxan-1-yl) propyl methacrylate.

8. The polymerization process of claim 5 wherein the monomers in the reaction are maleic anhydride, allyltrimethylsilane, t-butyl acrylate and methyl acrylate.

9. The polymerization process of claim 5 wherein the monomers in the reaction are maleic anhydride, allyltrimethylsilane, t-butyl acrylate and 3-(3,5,7,9,11,13,15-heptaethylpentacyclo [9.5.1.1$^{3,9}$.1$^{5,15}$.1$^{7,13}$]octa-siloxan-1-yl) propyl methacrylate.

10. A polymerization process for preparing an anhydride-containing polymer, the process comprising:
a) providing a reaction mixture comprising: an ethylenically unsaturated anhydride monomer, at least one ethylenically unsaturated non-anhydride monomer, a free radical initiator, and an alkyl substituted THF solvent of formula 1:

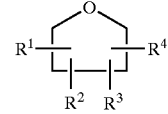

Formula 1 where $R^1$, $R^2$, $R^3$, and $R^4$ are independently chosen from the group consisting of hydrogen and $C_1$–$C_4$ linear or branched alkyl with the proviso that at least one of $R^1$, $R^2$, $R^3$, and $R^4$ is not H; and optionally a co-solvent;
b) polymerizing the reaction mixture; and
c) removing unreacted monomers, the alkyl substituted THF solvent, and any low-boiling volatile reaction products having a lower boiling point than the boiling point of any optional co-solvent employed.

11. The polymerization process of claim 10 wherein the removing step in step a) is by distillation.

12. The polymerization process of claim 11 wherein the alkyl-substituted tetrahydrofuran solvent is methyltetrahydrofuran.

13. The polymerization process of claim 11 wherein a co-solvent is also present in the reaction mixture.

14. The polymerization process of claim 12 wherein a co-solvent is also present in the reaction.

15. The polymerization process of claim 14 wherein the co-solvent is propylene glycol methyl ether acetate.

16. The polymerization process of claim 11 wherein the monomers in the reaction are maleic anhydride, allyltrimethylsilane, t-butyl acrylate and methyl acrylate.

17. The polymerization process of claim 11 wherein the monomers in the reaction are maleic anhydride, allyltrimethylsilane, t-butyl acrylate and 3-(3,5,7,9,11,13,15-heptaethylpentacyclo [$9.5.1.1^{3,9}.1^{5,15}.1^{7,13}$]octa-siloxan-1-yl) propyl methacrylate.

18. The polymerization process of claim 15 wherein the monomers in the reaction are maleic anhydride, allyltrimethylsilane, t-butyl acrylate and methyl acrylate.

19. The polymerization process of claim 15 wherein the monomers in the reaction are maleic anhydride, allyltrimethylsilane, t-butyl acrylate and 3-(3,5,7,9,11,13,15-heptaethylpentacyclo [$9.5.1.1^{3,9}.1^{5,15}.1^{7,13}$]octa-siloxan-1-yl) propyl methacrylate.

20. The polymerization process of claim 11 wherein the total number of carbon atoms from the substituents $R^1$, $R^2$, $R^3$ and $R^4$ is from about 1 to 6 carbon atoms.

21. The polymerization process of claim 11 wherein the alkyl-substituted tetrahyfrofuran is selected from the group consisting of 2-methyl tetrahydrofuran, 2-ethyl tetrahydrofuran, 3-methyl tetrahydrofuran, 3-ethyl tetrahydrofuran, 2-n-butyl tetrahydrofuran, 3-butyl tetrahydrofuran, 2,2-dimethyl tetrahydrofuran, 3,3dimethyl tetrahydrofuran, 2-t-butyl tetrahydrofuran, 2,2,5,5-tetramethyl tetrahydrofuran and 2,5-dimethyl tetrahydrofuran.

22. The polymerization process of claim 14 wherein the co-solvent is selected from the group consisting of propylene glycol methyl ether acetate and 2-heptanone.

23. The polymerization process of claim 11 wherein the anhydride-containing polymer produced by the process has a molecular weight (Mw) of from about 10,000 to about 40,000 with a poplydispersity of from about 1 to about 2.6.

24. The polymerization process of claim 16 wherein the anhydride-containing polymer produced by the process has a molecular weight (Mw) of from about 10,000 to about 40,000 with a poplydispersity of from about 1 to about 2.6 and the silicon content of the polymer is about 6 to about 14 weight percent.

25. The polymerization process of claim 17 wherein the anhydride-containing polymer produced by the process has a molecular weight (Mw) of from about 10,000 to about 40,000 with a poplydispersity of from about 1 to about 2.6 and the silicon content of the polymer is about 6 to about 14 weight percent.

26. The polymerization process of claim 18 wherein the anhydride-containing polymer produced by the process has a molecular weight (Mw) of from about 10,000 to about 40,000 with a poplydispersity of from about 1 to about 2.6 and the silicon content of the polymer is about 6 to about 14 weight percent.

27. The polymerization process of claim 19 wherein the anhydride-containing polymer produced by the process has a molecular weight (Mw) of from about 10,000 to about 40,000 with a poplydispersity of from about 1 to about 2.6 and the silicon content of the polymer is about 6 to about 14 weight percent.

* * * * *